United States Patent
Hsu

(10) Patent No.: US 8,757,970 B2
(45) Date of Patent: Jun. 24, 2014

(54) FAN BRACKET AND FAN FIXING APPARATUS USING THE SAME

(75) Inventor: Ming-Huai Hsu, Taichung (TW)

(73) Assignee: Accton Technology Corporation, Hsinchu (TW)

( * ) Notice: Subject to any disclaimer, the term of this patent is extended or adjusted under 35 U.S.C. 154(b) by 559 days.

(21) Appl. No.: 13/034,892

(22) Filed: Feb. 25, 2011

(65) Prior Publication Data

US 2011/0211948 A1    Sep. 1, 2011

(30) Foreign Application Priority Data

Mar. 1, 2010 (TW) .............................. 99203633 U

(51) Int. Cl.
*H05K 7/20* (2006.01)

(52) U.S. Cl.
USPC ........................................ 415/213.1; 361/695

(58) Field of Classification Search
USPC ......... 415/213.1, 214.1, 220; 361/695, 679.4, 361/697
See application file for complete search history.

(56) References Cited

U.S. PATENT DOCUMENTS

| | | | | |
|---|---|---|---|---|
| 5,969,941 A | * | 10/1999 | Cho | 361/679.48 |
| 7,385,814 B1 | * | 6/2008 | Chen | 361/695 |
| 2003/0095866 A1 | * | 5/2003 | Chuang | 415/176 |
| 2008/0253886 A1 | * | 10/2008 | Chen | 415/213.1 |

FOREIGN PATENT DOCUMENTS

TW    200740349 A  * 10/2007

* cited by examiner

*Primary Examiner* — Ned Landrum
*Assistant Examiner* — Kayla McCaffrey
(74) *Attorney, Agent, or Firm* — WPAT, PC; Justin King

(57) ABSTRACT

A fan bracket and the fan fixing apparatus using the same are disclosed, in which the fan bracket, including a pair of fixing members, is used for fixing a fan assembly inside a housing. Each fixing member has a first panel and two positioning elements, in which the first panel is configured with a first end, a second end and a first side in a manner that the first and the second ends are located opposite to one another while enabling the first side to be located between the two ends. In an embodiment, there is at least one fixing plate disposed on the first side that each fixing plate has at least one first screw hole. Moreover, the two fixing members are symmetrically and respectively disposed at the first and the second ends of the first panel whereas each fixing member is configured with a second screw hole.

14 Claims, 10 Drawing Sheets

FAN BRACKET AND FAN FIXING APPARATUS USING THE SAME

FIELD OF THE INVENTION

The present invention relates to a fan bracket and a fan fixing apparatus using the same, and more particularly, to a low-cost fan fixing apparatus with broad application range that is adapted for fixing various heat-dissipating fans with different thickness while allowing the airflow of those heat-dissipating fans to flow inwardly or outwardly without interruption.

BACKGROUND OF THE INVENTION

Since the processing performance in electronic devices is gradually enhanced, the demand for better heat dissipation is increased. Conventionally, the heat dissipation for servers can be enhanced by the installation of multiple heat-dissipating fans, wherein there can be three, four or more heat-dissipating fans for a server. Generally, those heat-dissipating fans are arranged side by side, and the heat-dissipating fans are fixedly secured inside the seat body or the housing of electronic devices through components such as screws, hooks, external frames, or other fixing members.

For those fan fixing apparatuses, its structure can be merely adapted for securing one heat-dissipating fan with a single thickness. For example, if one conventional fan fixing apparatus is designed for fixing a type of heat-dissipating fan with 28 mm in thickness, it can not be used for fixing other heat-dissipating fans with different thicknesses, such as the one of 56 mm in thickness. In addition, the heat-dissipating fans are capable of blowing airflows in two opposite directions, but the conventional fan fixing apparatuses can only fix the heat-dissipating fan at one airflow direction and may not be simultaneously applied in the opposite directions.

When heat-dissipating fans of different thicknesses are used or the heat-dissipating fans are designed to blow in different directions, it is required to have different fixing apparatuses for securing those different heat-dissipating fans. Consequently, the foregoing defect does not only increase the cost in manufacturing molds, but also prepares different fixing apparatuses simultaneously to consume the purchasing expenses and to occupy spaces due to its volume.

SUMMARY OF THE INVENTION

In view of the disadvantages of prior art, a primary object of the present invention is to provide a low-cost fan fixing apparatus with broad applicable range that is adapted for fixing various heat-dissipating fans of different thickness while allowing the airflow of those heat-dissipating fans to flow inwardly or outwardly without interruption.

To achieve the above object, the present invention provides a fan bracket, adapted for fixing at least one heat-dissipating fan to a housing, comprising:
  a pair of fixing members further comprising:
    a first panel configured with a first end, a second end corresponding to the first end and a first side disposed between the first end and the second end; and
    two positioning elements symmetrically disposed at the first end and the second end of the first panel, the positioning element each having at least one second screw hole;
  wherein, the first side of the first panel is configured with at least one fixing plate when the at least one fixing plate is slightly perpendicular to the first panel; and each fixing plate is formed with at least one first screw hole.

To achieve the above object, the present invention provides a fan fixing apparatus, comprising:
  a housing, configured with a venting surface;
  at least one heat-dissipating fan, the at least one heat-dissipating fan configured with a shell having specific thickness, and the shell having at least one fan screw hole, a top and a bottom corresponding to each other while locating an airflow outlet at a side of the shell between the top and the bottom, and an airflow inlet located at another side of the shell that is opposite to the airflow outlet; and
  a fan bracket, further comprising:
    a pair of fixing members, comprising:
      a first panel, configured with a first end, a second end corresponding to the first end and a first side disposed between the first end and the second end; and
      two positioning elements symmetrically disposed at the first end and the second end of the first panel, the positioning element each having at least one second screw hole;
      having at least one second screw hole;
  wherein the first side of the first panel is configured with at least one fixing plate when the at least one fixing plate is slightly perpendicular to the first panel; and each fixing plate is formed with at least one first screw hole; the at least one heat-dissipating fan is fixedly secured between the pair of fixing members; and at least one first bolt passes through the first screw hole screwed fixedly into the fan screw hole, and simultaneously at least one second bolt passes through the second screw hole screwed fixedly into a housing screw hole, and the fixing member, the heat-dissipating fan and the housing are coupled together.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
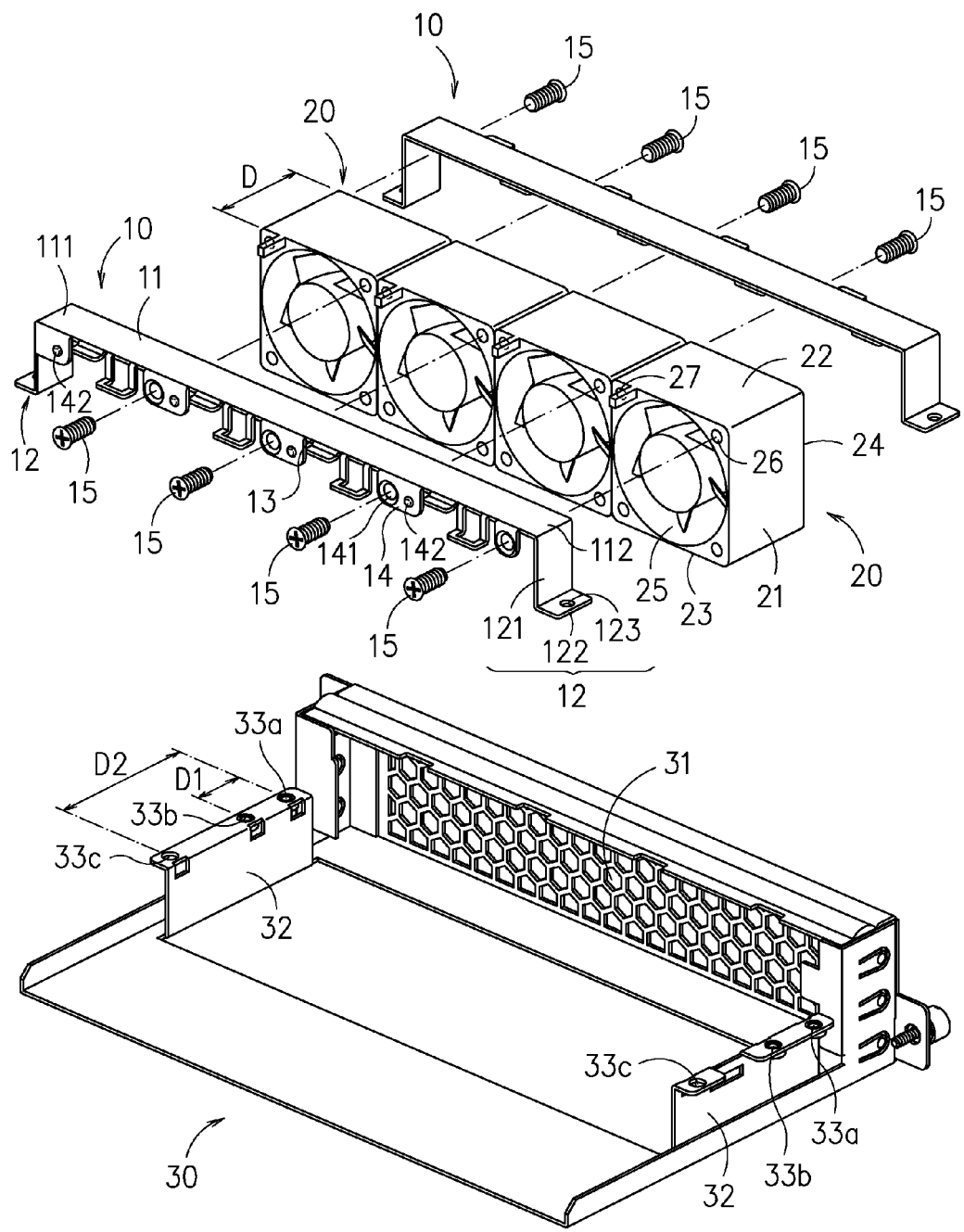
FIG. 1 is an exploded view of a fan fixing apparatus according to a first embodiment of the present invention.

Please refer to FIG. 1, which is an exploded view of a fan fixing apparatus according to a first embodiment of the present invention. As shown in FIG. 1, a fan bracket used in a fan fixing apparatus of FIG. 1 includes: a pair of fixing members 10, which are used cooperatively for fixing a heat-dissipating fans 20 onto a housing 30. Each heat-dissipating fan 20 shown in FIG. 1 is configured with a shell 21 of a specific thickness D, and the shell 21 is formed with a top 22, a bottom 23, an airflow outlet 24 located at a side of the shell 21 between the top 22 and the bottom 23, and an airflow inlet 25 located at another side of the shell 21 corresponding to the airflow inlet 24, at least one fan screw hole 26, and a recess 27. The housing 30 is further configured with a net-like venting surface 31, which has two screw bases 32 disposed symmetrically and opposite to each other at the two sides of the venting surface 31 and each screw base 32 is configured with three housing screw holes 33a, 33b and 33c in a manner that the two housing screw holes 33a, 33b are spaced from each other by a first interval D1 while the two housing screw holes 33b, 33c are spaced from each other by a second interval D2, and the first interval D1 is not equal to the second interval D2. In this embodiment, the first interval D1 is provided for fixing a heat-dissipating fan with 28 mm in thickness, and the second interval D2 is provided for fixing a heat-dissipating fan with 56 mm in thickness.

The pair of fixing elements 10 is symmetrically disposed and each fixing element 10 is configured with a first panel 11 and two positioning elements 12. As shown in FIG. 1, the first panel 11 is formed with a first end 111, a second end 112 and a first side 13 disposed at a position between the first end 111 and the second end 112, whereas the first side 13 of the first panel 11 is configured with a plurality of fixing plates 14 while each fixing plate 14 is slightly perpendicular to the first panel 11, and each fixing plate 14 is formed with at least one first screw hole 141 that aligns the fan screw hole 26 of the corresponding heat-dissipating fan 20. Moreover, the two positioning elements 12 are connected respectively to the first end 111 and the second end 112 of the first panel 11, and each positioning element 12 is composed of a connecting part 121 and a positioning part 122, in that the connecting part 121 is vertically connected to the first panel 11 when the positioning part 122 is perpendicular to the connecting part 121. In addition, each positioning part 122 is formed with a second screw hole 123. In FIG. 1, each fixing plate 14 is formed with a protrusion 141 that is inserted into the recess 27 of its corresponding heat-dissipating fan 20.

Figure 2:
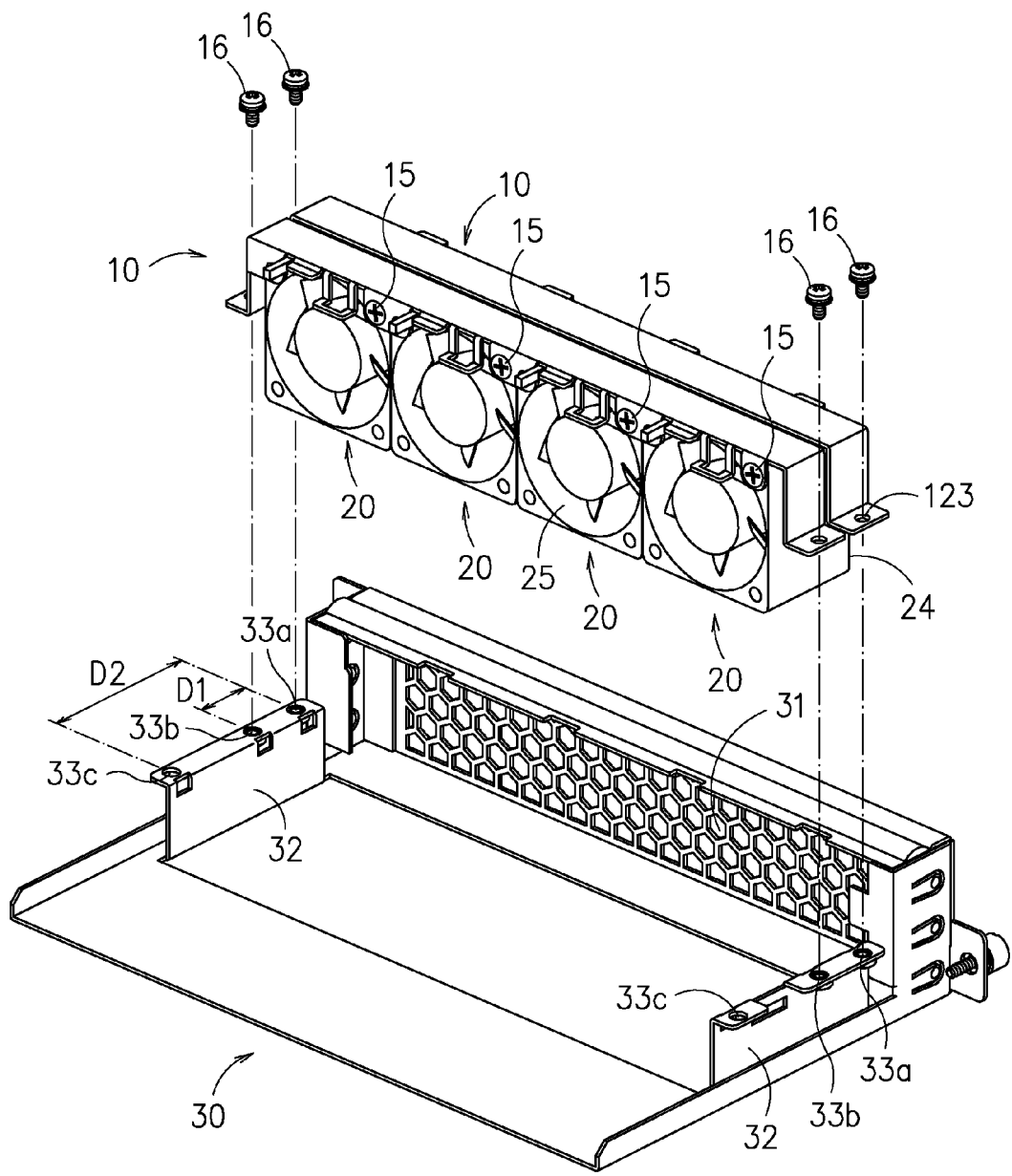
FIG. 2 is a schematic diagram showing how a fan assembly is being fixed to a housing by screwing using the fan fixing apparatus shown in the first embodiment.
Figure 3:
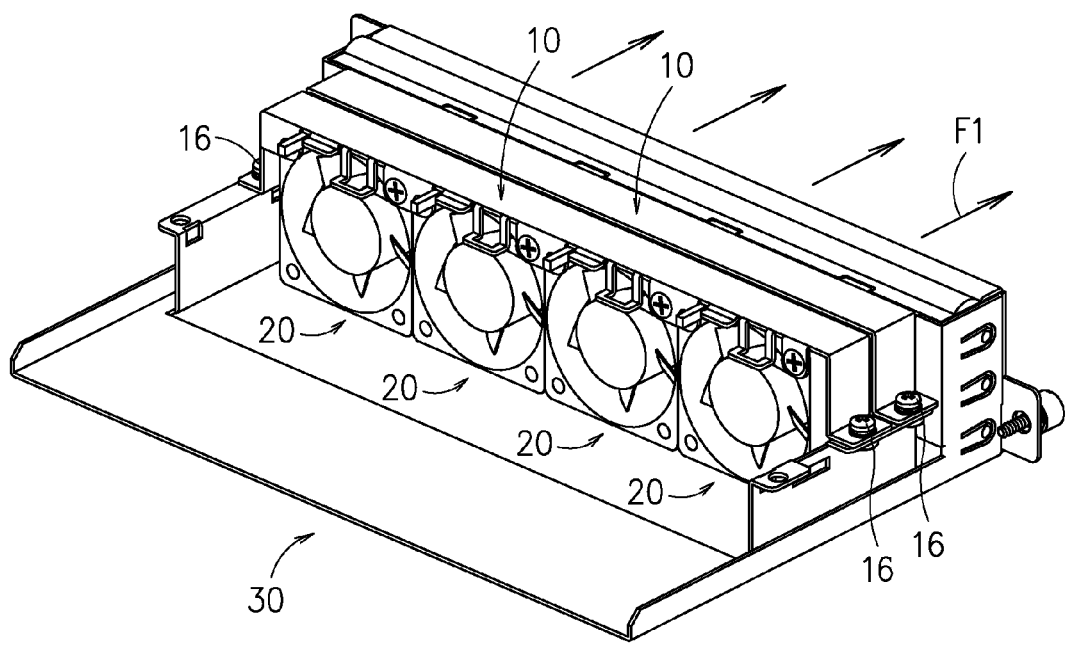
FIG. 3 is a three dimensional view of the fan fixing apparatus shown in the first embodiment.

As shown in FIG. 1, FIG. 2 and FIG. 3, the heat-dissipating fans 20 are sandwiched between the pair of the fixing members 10. Thereby, the first panels 11 of the pair of fixing members 10 will engage to the tops 22 of the heat-dissipating fans 20, and the fixing plates 14 of the two fixing members 10 are respectively engaged with the shell side corresponding to the airflow inlet 25 and the shell side corresponding to the airflow outlet 24. By passing the first bolts 15 through their corresponding first screw holes 141 and screwing the same to the fan screw holes 26 of the heat-dissipating fans 20 while embedding the protrusions 142 of the fixing plates 14 to the recesses 27 of their corresponding heat-dissipating fans 20, the heat-dissipating fans 20 are integrated with the fixing members 10, as shown in FIG. 2. Thereafter, by passing the second bolts 16 through the second screw holes 123 and screwing the same to their corresponding housing screw holes 33a and 33b that are formed on the screw bases 32 of the housing 30, the fixing members 10, the heat-dissipating fans 20 are integrated with the housing 30, as shown in FIG. 3. In this embodiment, as there are four heat-dissipating fans 20 with 28 mm in thickness being used for illustration, the housing screw holes 33a and 33b that are spaced from each other by the first interval D1 used for screwing the fixing members 10 to the housing 30. Moreover, as the airflow outlet 24 is disposed facing toward the venting surface 31 of the housing 30, the airflow of the heat-dissipating fans 20 is blowing in a direction F1 from the heat-dissipating fans 20 to the outside of the housing 30.

Figure 4:
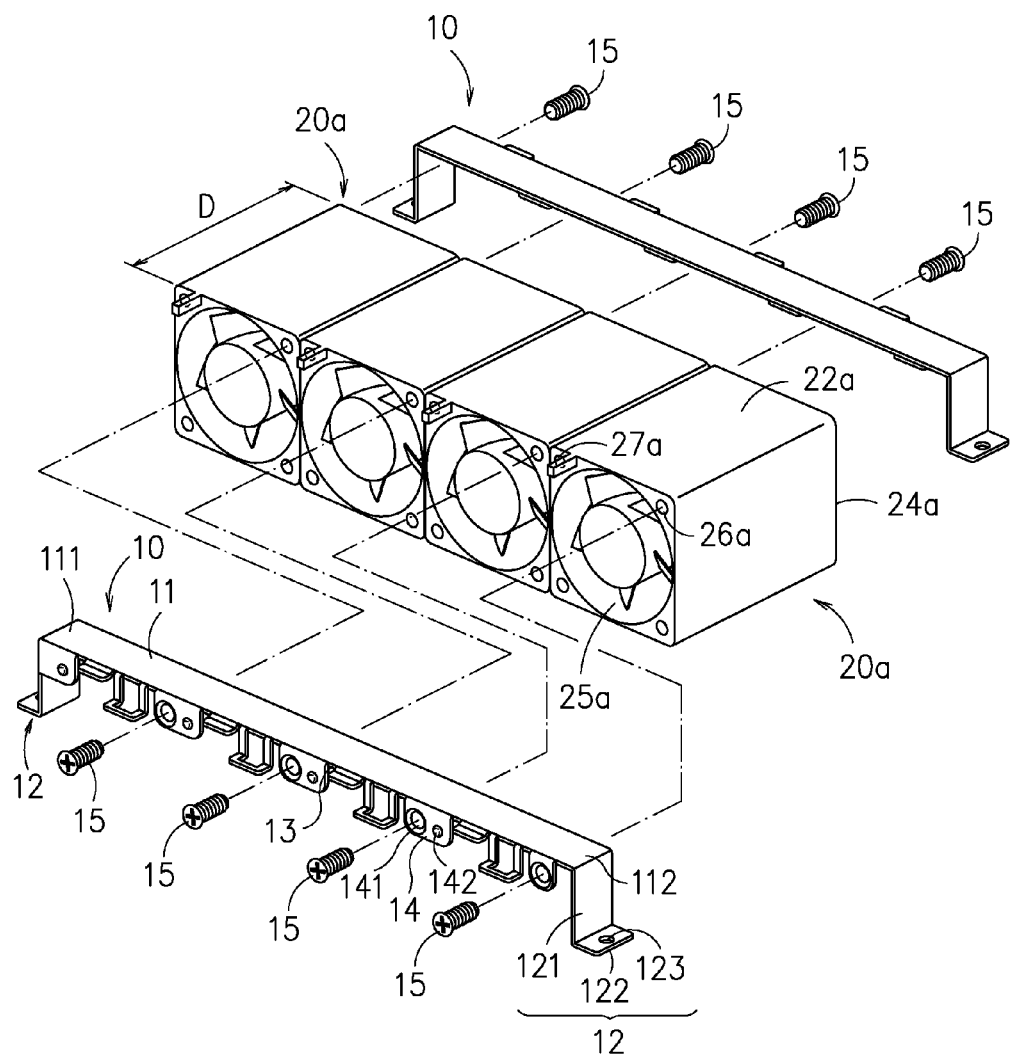
FIG. 4 is an exploded view of a fan fixing apparatus according to a second embodiment of the present invention.
Figure 5:
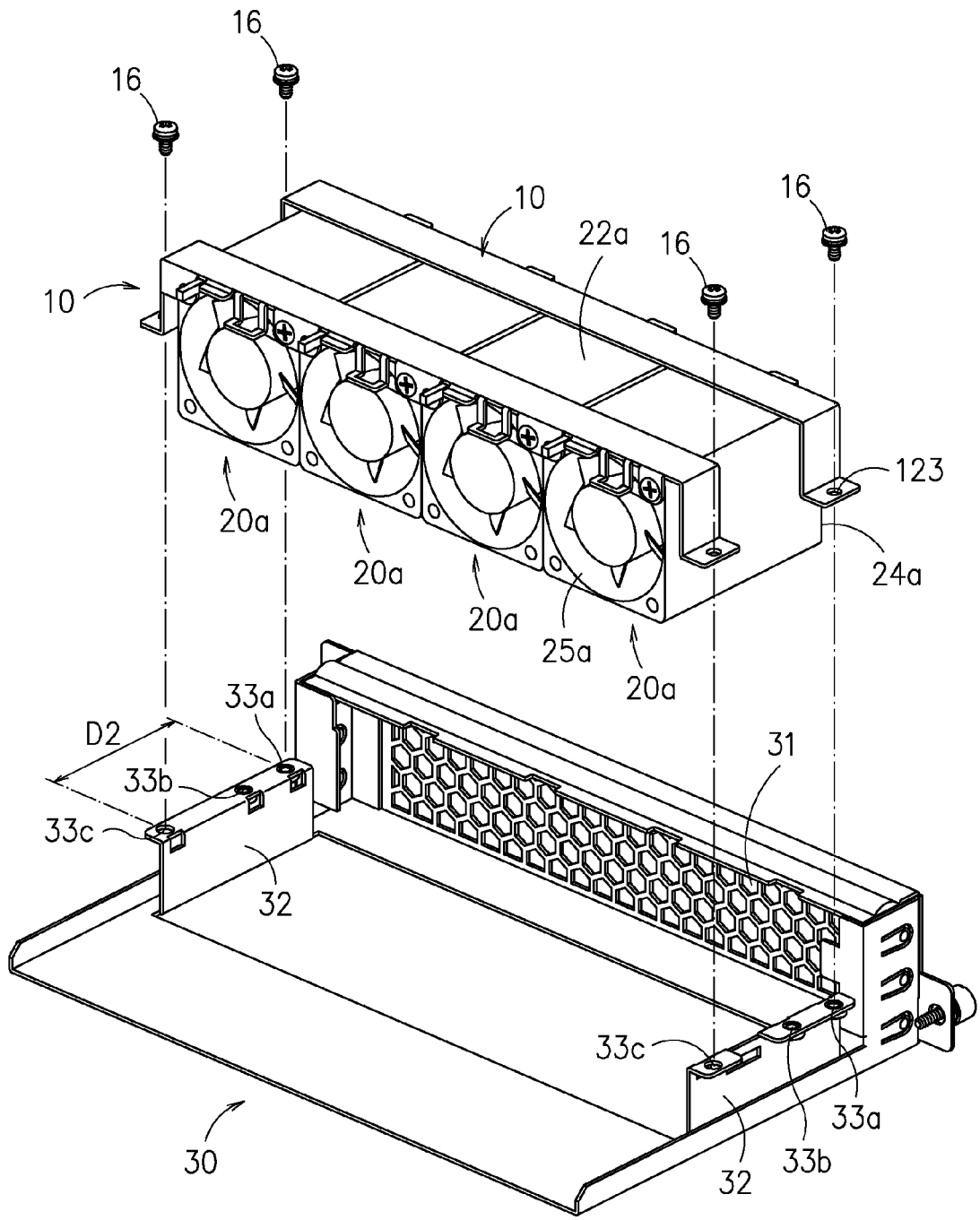
FIG. 5 is a schematic diagram showing how a fan assembly is being fixed to a housing by screwing using the fan fixing apparatus shown in the second embodiment.
Figure 6:
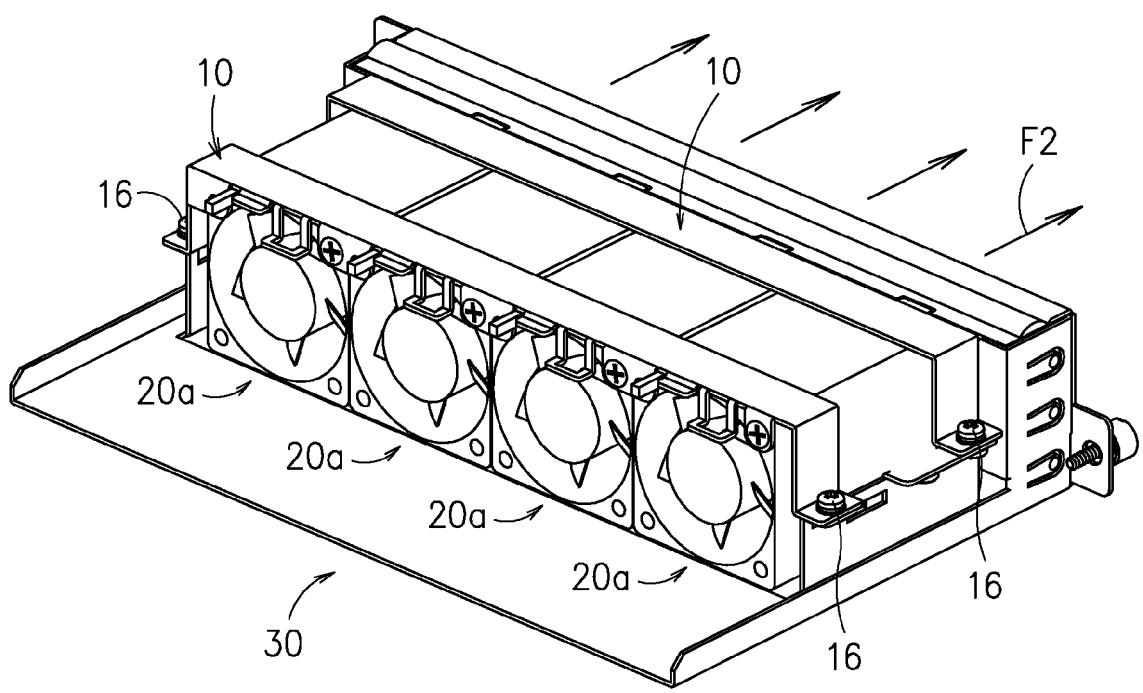
FIG. 6 is a three dimensional view of the fan fixing apparatus shown in the second embodiment.

Please refer to FIG. 4 to FIG. 6, which are schematic diagram showing how a fan assembly is being fixed to a housing by using the fan fixing apparatus according to a second embodiment. The fan bracket in this embodiment is composed of a pair of fixing members 10, whereas each fixing member 10 is provided for fixing heat-dissipating fans 20a to a housing. It is noted that the housing 30 and the fixing members 10 are structured basically the same as those shown in the first embodiment. The difference between the second embodiment and the first embodiment is that: the heat-dissipating fans 20a in this embodiment is formed with a larger thickness, which can be about 56 mm in thickness; and the heat-dissipating fans 20a are sandwiched between the pair of the fixing members 10, and the first panels 11 of the pair of fixing members 10 will engage to the tops 22a of the heat-dissipating fans 20, and the fixing plates 14 of the two fixing members 10 are disposed respectively engaging with the shell side corresponding to the airflow inlet 25a and the shell side corresponding to the airflow outlet 24a. Similarly, by passing the first bolts 15 through their corresponding first screw holes 141 and screwing the same to the fan screw holes 26a of the heat-dissipating fans 20a while insetting the protrusions 142 of the fixing plates 14 to the recesses 27 of their corresponding heat-dissipating fans 20a, the heat-dissipating fans 20 are integrated with the fixing members 10, as shown in FIG. 5. Thereafter, by passing the second bolts 16 through the second screw holes 123 and screwing the same to their corresponding housing screw holes 33a and 33c that are formed on the screw bases 32 of the housing 30, the fixing members 10, the heat-dissipating fans 20a are integrated with the housing 30, as shown in FIG. 6. In this embodiment, as there are four heat-dissipating fans 20a with 56 mm in thickness are used for illustration, the housing screw holes 33a and 33c that are spaced from each other by the second interval D2 are used for screwing the fixing members 10 to the housing 30. Moreover, as the airflow outlet 24a is disposed facing toward the venting surface 31 of the housing 30, the airflow of the heat-dissipating fans 20a is blowing in a direction F2 from the heat-dissipating fans 20 to the outside of the housing 30. From the illustration shown in the second embodiment, it is noted that the fan fixing apparatus can be adapted for fixing various heat-dissipating fans of different thicknesses. As for the structure of the housing 30 and the arrangement relating to the disposition of the housing screw holes 33a, 33b, 33c on the screw bases 32 shown in this embodiment, they are only being demonstrated for illustration and are not limited thereby, so that the housing can be in any form other than the one shown in this embodiment and there can be more or less than three housing screw holes being formed on the screw bases. Thus, the fan fixing apparatus of the present disclosure can be adapted for fixing various heat-dissipating fans of different thicknesses to any kind of housing following the same assembling procedure.

Figure 7:
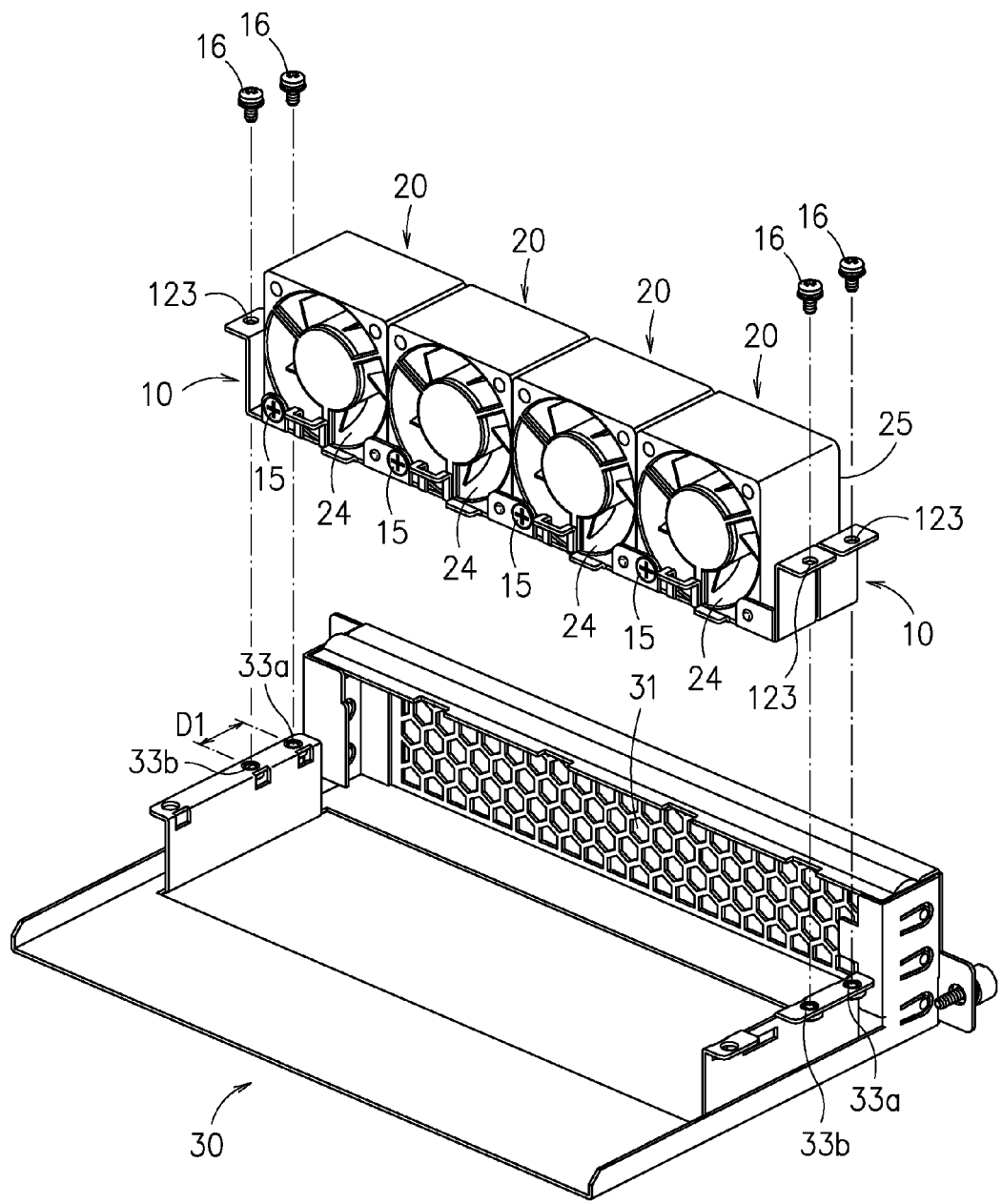
FIG. 7 is a schematic diagram showing how a fan assembly is being fixed to a housing by screwing using the fan fixing apparatus shown in a third embodiment of the present embodiment.
Figure 8:
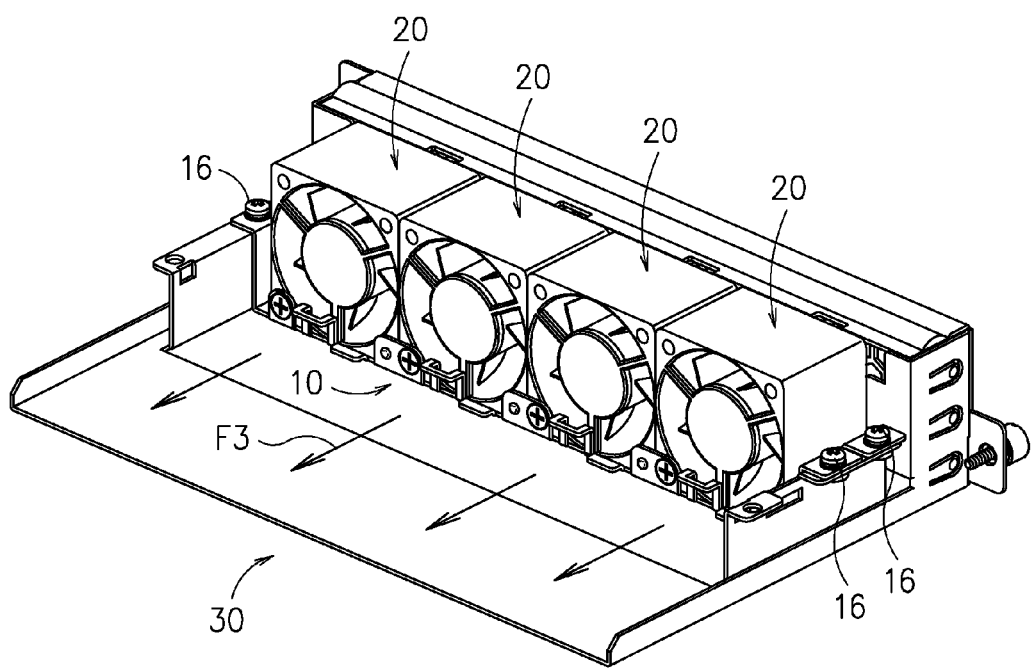
FIG. 8 is a three dimensional view of the fan fixing apparatus shown in the third embodiment.

Please refer to FIG. 7 and FIG. 8, which are schematic diagram showing how a fan assembly is being fixed to a housing by screwing using the fan fixing apparatus according to a third embodiment. In this embodiment, the fan fixing apparatus is comprised of: a pair of fixing members 10, four heat-dissipating fans 20, and a housing 30, whereas each fixing member 10, the heat-dissipating fans 20 and the housing 30 are structured basically the same as those shown in the first embodiment. The present embodiment is characterized in that: after the heat-dissipating fans 20 are assembled with the fixing members 10, the airflow inlet 25 of each heat-dissipating fan 20 is arranged facing toward the venting surface 31 of the housing in the assembling of the heat-dissipating fan 20, so that the airflow of the heat-dissipating fans 20 is blowing in a direction F3 from outside into the interior of the housing 30, as shown in FIG. 8. Comparing the assembly shown in FIG. 7 with the one shown in FIG. 2, the assembly of the fixing members 10 and the heat-dissipating fans 20 shown in FIG. 7 is achieved simply by turning the assembly of FIG. 2 upside down while enabling the side of each heat-dissipating fan 20 that are originally facing toward the venting surface 31 to be reversed and thus facing away from the venting surface 31. That is, the assembly of the fixing members 10 and the heat-dissipating fans 20 shown in FIG. 7 is basically the same as the one shown in FIG. 2, but is different in that: it is being turned and disposed upside down. Other than that, the fixing members 10 are still being screwed to the housing screw holes 33a and 33b by the use of the second bolts 16, whereas the housing screw holes 33a, 33b are spaced from each other by the same first interval D1. Accordingly, by the illustration shown in this embodiment, it is noted that the fan fixing apparatus can be adapted for allowing the airflow of those heat-dissipating fans to flow inward or outward without interruption. In addition to the aforesaid turning of the assembly of the fixing members 10 and the heat-dissipating fans 20, the changing of the airflow direction of the fans 20 can also be achieved by enabling the side of each-heat-dissipating fan 20 that was originally facing toward the venting surface 31 to be arranged away from the venting surface 31 while allowing the fixing members 10 to be fixed to the tops of the heat-dissipating fans 20 as they did in FIG. 2.

Figure 9:
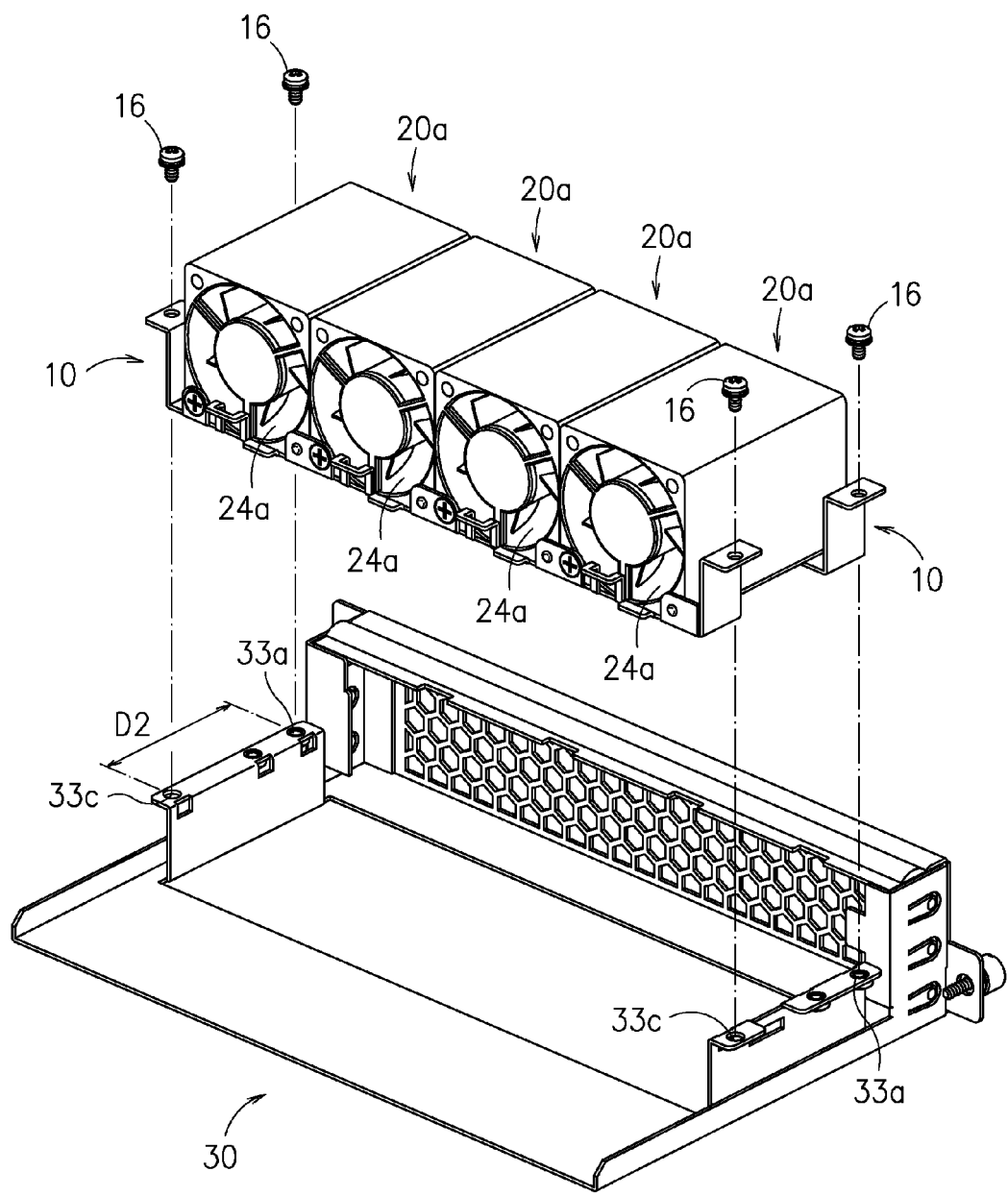
FIG. 9 is a schematic diagram showing how a fan assembly is being fixed to a housing by screwing using the fan fixing apparatus shown in a fourth embodiment of the present embodiment.
Figure 10:
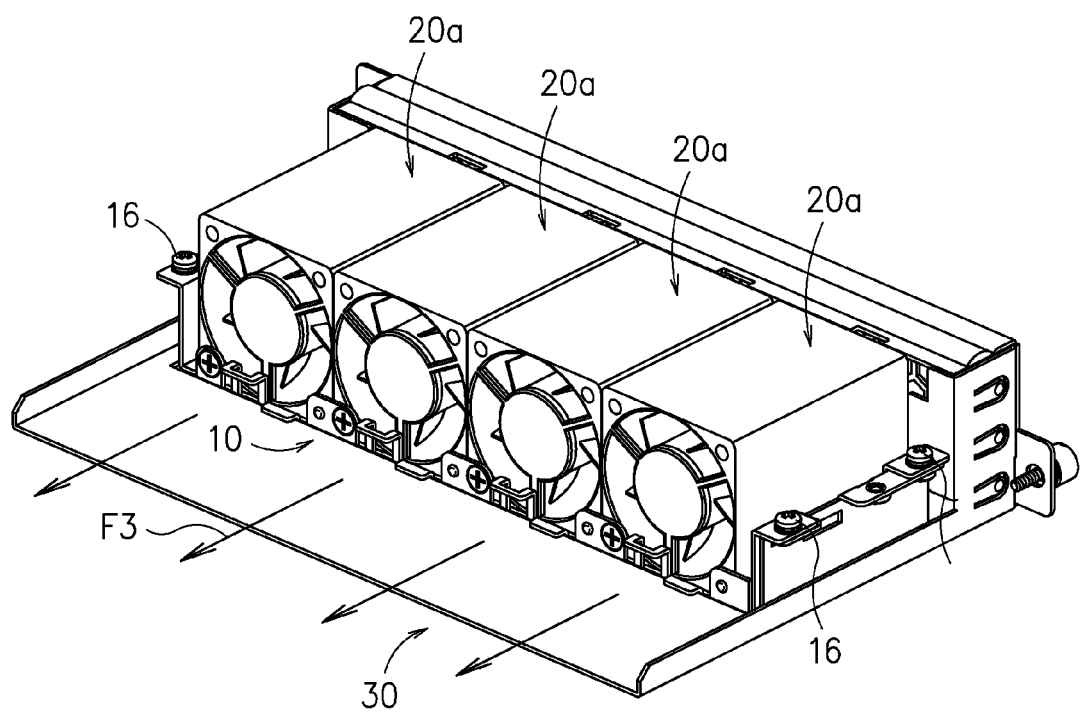
FIG. 10 is a three dimensional view of the fan fixing apparatus shown in the fourth embodiment.

Please refer to FIG. 9 and FIG. 10, which are schematic diagram showing how a fan assembly is being fixed to a housing by screwing using the fan fixing apparatus according to a fourth embodiment. In this embodiment, the fan fixing apparatus is comprised of: a pair of fixing members 10, four heat-dissipating fans 20a, that are structured basically the same as those shown in the third embodiment, but is different in that: the thickness of each heat-dissipating fan 20 in this embodiment is larger than that shown in FIG. 7 Thereby, instead of the housing screw holes 33a and 33b, the fixing members 10 are being screwed to the housing screw holes 33a and 33c by the use of the second bolts 16, since the housing screw holes 33a, 33c are spaced from each other by the larger second interval D2. Accordingly, the airflow of the heat-dissipating fans 20a is blowing in a direction F4 from outside into the interior of the housing 30.

To sum up, the present disclosure provides a low-cost fan fixing apparatus with broad applicable range that is adapted for fixing various heat-dissipating fans of different thickness in dimension while allowing the airflow of those heat-dissipating fans to flow inward or outward without interruption.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A fan bracket, adapted for fixing at least one heat-dissipating fan to a housing, comprising:
 a pair of fixing members, wherein each fixing member further comprising:
  a first panel configured with a first end, a second end corresponding to the first end and a first side disposed between the first end and the second end; and
  two positioning elements symmetrically disposed at the first end and the second end of the first panel, the positioning element each having at least one second screw hole;
 wherein, the first side of the first panel is configured with at least one fixing plate, the at least one fixing plate is slightly perpendicular to the first panel, and each fixing plate is formed with at least one first screw hole;
 wherein the at least one heat-dissipating fan is configured with a shell having thickness, and the shell has a top and a bottom corresponding to each other, wherein the first panels of the pair of fixing members are disposed to the top of the heat-dissipating fan;
 wherein the housing has at least three housing screw holes;
 wherein a first interval is between two of the at least three housing screw holes, a second interval is between other two of the at least three housing screw holes;
 wherein the first interval is provided for fixing a heat-dissipating fan with 28 mm in thickness, and the second interval is provided for fixing a heat-dissipating fan with 56 mm in thickness.

2. The fan bracket of claim 1, wherein each positioning element is composed of a connecting part and a positioning part, the connecting part is vertically connected to the first panel and the positioning part is perpendicular to the connecting part.

3. The fan bracket of claim 1, wherein the housing has at least two screw hole bases disposed symmetrically, and each screw hole base is configured with the at least three housing screw holes.

4. The fan bracket of claim 1,
 wherein an airflow outlet is located at a side of the shell of the at least one heat-dissipating fan between the top and the bottom, and an airflow inlet is located at another side of the shell that is opposite to the airflow outlet;
 wherein the fixing plate mounted on the first panel of one of the two fixing members is disposed engaging with the side of the shell corresponding to the airflow inlet, and the fixing plate mounted on the first panel of another fixing member is disposed engaging with the side of the shell corresponding to the airflow outlet.

5. The fan bracket of claim 4, wherein the housing is further configured with a venting surface, and the airflow outlet of the at least one heat-dissipating fan is toward the venting surface of the housing.

6. The fan bracket of claim 4, wherein the housing is further configured with a venting surface, and the airflow inlet of the at least one heat-dissipating fan is disposed facing toward the venting surface of the housing.

7. The fan bracket of claim 1, wherein at least one protrusion is formed on the fixing plate, and at least a recess is formed on the at least one heat-dissipating fan, and the at least one heat-dissipating fan is fixedly secured between the pair of fixing members through the protrusion inserted into the recess.

8. A fan fixing apparatus, comprising:
a housing, configured with a venting surface;
at least one heat-dissipating fan, the at least one heat-dissipating fan configured with a shell having specific thickness, and the shell having at least one fan screw hole, a top and a bottom corresponding to each other while locating an airflow outlet at a side of the shell between the top and the bottom, and an airflow inlet located at another side of the shell that is opposite to the airflow outlet; and
a fan bracket, further comprising:
a pair of fixing members, wherein each fixing member comprising:
a first panel, configured with a first end, a second end corresponding to the first end and a first side disposed between the first end and the second end; and
two positioning elements symmetrically disposed at the first end and the second end of the first panel, the positioning element having at least one second screw hole;
wherein the first side of the first panel is configured with at least one fixing plate, the at least one fixing plate is slightly perpendicular to the first panel, and each fixing plate is formed with at least one first screw hole;
wherein the first panels of the pair of fixing members are disposed to the top of the heat-dissipating fan;
wherein the at least one heat-dissipating fan is fixedly secured between the pair of fixing members; and at least one first bolt passes through the first screw hole screwed fixedly into the fan screw hole, and simultaneously at least one second bolt passes through the second screw hole screwed fixedly into a housing screw hole, and the fixing member, the heat-dissipating fan and the housing are coupled together;
wherein the housing has at least three housing screw holes;
wherein a first interval is between two of the at least three housing screw holes, a second interval is between other two of the at least three housing screw holes;
wherein the first interval is provided for fixing a heat-dissipating fan with 28 mm in thickness, and the second interval is provided for fixing a dissipating fan with 56 mm in thickness.

9. The fan fixing apparatus of claim 8, wherein each positioning element is composed of a connecting part and a positioning part, the connecting part is vertically connected to the first panel and the positioning part is perpendicular to the connecting part.

10. The fan fixing apparatus of claim 8, wherein the housing has at least two screw hole bases disposed symmetrically, and each screw hole base is configured with the at least three housing screw holes.

11. The fan fixing apparatus of claim 8, wherein the fixing plate mounted on the first panel of one of the two fixing members is disposed engaging with the side of the shell corresponding to the airflow inlet, and the fixing plate mounted on the first panel of another fixing member is disposed engaging with the side of the shell corresponding to the airflow outlet.

12. The fan fixing apparatus of claim 11, wherein the airflow outlet of the at least one heat-dissipating fan is toward a venting surface of the housing.

13. The fan fixing apparatus of claim 11, wherein the airflow inlet of the at least one heat-dissipating fan is disposed facing toward the venting surface of the housing.

14. The fan fixing apparatus of claim 8, wherein at least one protrusion is formed on the fixing plate, and at least a recess is formed on the at least one heat-dissipating fan, and thus, and the at least one heat-dissipating fan is fixedly secured between the pair of fixing members through the protrusion inserted into the recess.

* * * * *